United States Patent
Jaussi et al.

(10) Patent No.: US 6,825,696 B2
(45) Date of Patent: Nov. 30, 2004

(54) DUAL-STAGE COMPARATOR UNIT

(75) Inventors: James E. Jaussi, Hillsboro, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 09/893,184

(22) Filed: Jun. 27, 2001

(65) Prior Publication Data

US 2003/0001625 A1 Jan. 2, 2003

(51) Int. Cl.[7] .............................................. G01R 19/00
(52) U.S. Cl. ............................ 327/55; 327/52; 330/253
(58) Field of Search ........................... 327/52–57, 563; 330/252, 253

(56) References Cited

U.S. PATENT DOCUMENTS

| | | | | |
|---|---|---|---|---|
| 4,333,025 A | * | 6/1982 | Domogalla ................... 327/67 |
| 4,602,167 A | * | 7/1986 | Yukawa ........................ 327/65 |
| 4,670,671 A | | 6/1987 | De Weck ...................... 327/66 |
| 4,710,724 A | | 12/1987 | Connell et al. ................ 330/9 |
| 4,754,169 A | | 6/1988 | Morris ........................ 327/307 |
| 4,868,417 A | | 9/1989 | Jandu ........................... 327/65 |
| 4,987,327 A | | 1/1991 | Fernandez et al. .......... 327/543 |
| 5,245,223 A | | 9/1993 | Lim et al. ..................... 327/80 |
| 5,455,802 A | * | 10/1995 | McClure ..................... 365/233 |
| 5,508,643 A | * | 4/1996 | Khieu .......................... 327/51 |
| 5,541,538 A | | 7/1996 | Bacrania et al. ............. 327/77 |
| 5,563,533 A | * | 10/1996 | Cave et al. ................... 327/67 |
| 5,563,598 A | | 10/1996 | Hickling ..................... 341/155 |
| 5,608,757 A | | 3/1997 | Smith et al. ................ 375/229 |
| 5,844,428 A | * | 12/1998 | Jiang ........................... 327/57 |
| 5,942,919 A | * | 8/1999 | Ang et al. .................... 327/57 |
| 5,955,899 A | * | 9/1999 | Afghahi ....................... 327/65 |
| 5,963,060 A | * | 10/1999 | Varadarajan et al. .......... 327/55 |
| 6,028,457 A | | 2/2000 | Tihanyi ........................ 327/77 |
| 6,114,882 A | | 9/2000 | Flynn ......................... 327/103 |
| 6,147,514 A | * | 11/2000 | Shiratake ..................... 327/55 |
| 6,172,535 B1 | | 1/2001 | Hopkins ...................... 327/66 |
| 6,255,875 B1 | * | 7/2001 | Gabara ....................... 327/201 |
| 6,344,761 B2 | * | 2/2002 | Nishimura et al. ........... 327/55 |
| 6,348,882 B1 | | 2/2002 | Ciccone et al. ............. 341/56 |
| 6,359,473 B1 | * | 3/2002 | You et al. .................... 327/55 |
| 6,388,521 B1 | | 5/2002 | Henry ........................ 330/258 |

* cited by examiner

Primary Examiner—Kenneth B. Wells
(74) Attorney, Agent, or Firm—Schwegman, Lundberg, Woessner & Kluth, P.A.

(57) ABSTRACT

A comparator unit includes a first amplifier stage and a second amplifier stage. The first amplifier stage includes a differential amplifier having a pair of input nodes for receiving a differential signal and a pair of output nodes, a switch connected across the pair of output nodes, and a non-linear load connected across the pair of output nodes. The second amplifier stage is coupled to the pair of output nodes of the first amplifier stage. In one embodiment the second amplifier stage is a non-linear amplifier. In an alternative embodiment, the differential amplifier is a differential pair. In another alternative embodiment, the differential amplifier is a pair of differential pairs.

18 Claims, 8 Drawing Sheets

DUAL-STAGE COMPARATOR UNIT

FIELD

This invention relates to integrated circuits and, more particularly, to integrated circuit comparators.

BACKGROUND

A comparator is a circuit that compares the instantaneous magnitude of a first input signal to the magnitude of a second input signal. If the magnitude of the first input signal is less than the magnitude of the second input signal, then the comparator generates an output signal having a first logic level. If the magnitude of the first input signal is greater than the magnitude of the second input signal, then the comparator generates an output signal having a second logic level.

An ideal comparator has infinite gain and infinite bandwidth. A comparator having infinite gain and infinite bandwidth can convert a small analog signal to a large logic signal very quickly. Unfortunately, most comparators are not ideal. The gain of most high-bandwidth comparators is usually low, less than about ten, and the bandwidth of most high-gain comparators is also low, less than about one megahertz. For some comparator applications, such as detecting a light level change in a smoke detector, the gain-bandwidth product is not critical to the success of the application. A comparator having a gain of about ten and a bandwidth of about one megahertz is suitable for use in connection with a smoke detector. However, there is a great demand for comparators that can operate in high-speed signaling applications that are common in modem digital systems, such as microprocessors, digital signal processors, communications circuits, and storage systems. These high-speed signaling applications require the comparator gain to be as high as possible, usually much greater than ten, and the comparator bandwidth also to be as high as possible, usually much greater than one megahertz.

For these an other reasons there is a need for a comparator having a high gain-bandwidth product.

DESCRIPTION

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1A:
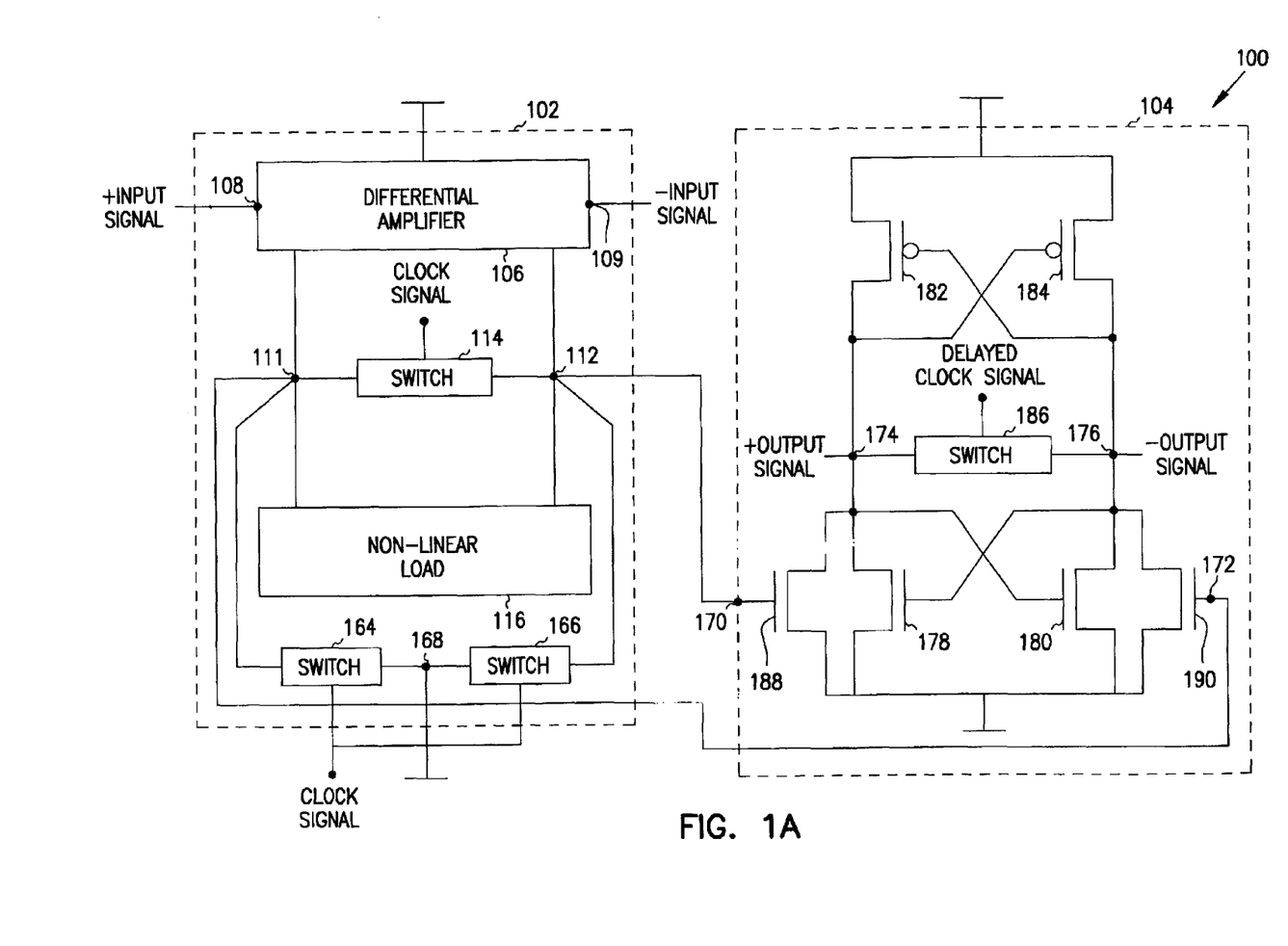
FIG. 1A is a block diagram of some embodiments of a comparator unit, according to the teachings of the present invention.

FIG. 1A is a block diagram of some embodiments of a comparator unit 100 according to the teachings of the present invention. The comparator unit 100 includes a first amplifier stage 102 and a second amplifier stage 104.

The first amplifier stage 102, in one embodiment, includes a differential amplifier 106, a switch 114, and a non-linear load 116. The differential amplifier 106 includes a pair of input nodes 108 and 109 and a pair of output nodes 111 and 112. The switch 114 and the non-linear load 116 are connected across the pair of output nodes 111 and 112.

The differential amplifier 106 is not limited to a particular type of differential amplifier, however the differential amplifier 106 preferably comprises a high-gain linear differential amplifier.

Figure 1B:
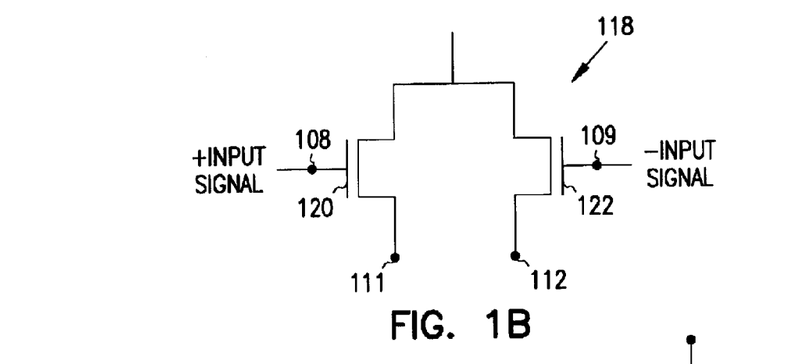
FIG. 1B is a schematic diagram of one embodiment of the differential amplifier shown in FIG. 1A, according to the teachings of the present invention.

Referring to FIG. 1B, in one embodiment, the differential amplifier 106 (shown in FIG. 1A) comprises a differential pair 118, including isolated gate field effect transistors 120 and 122, configured as shown in FIG. 1B.

Figure 1C:
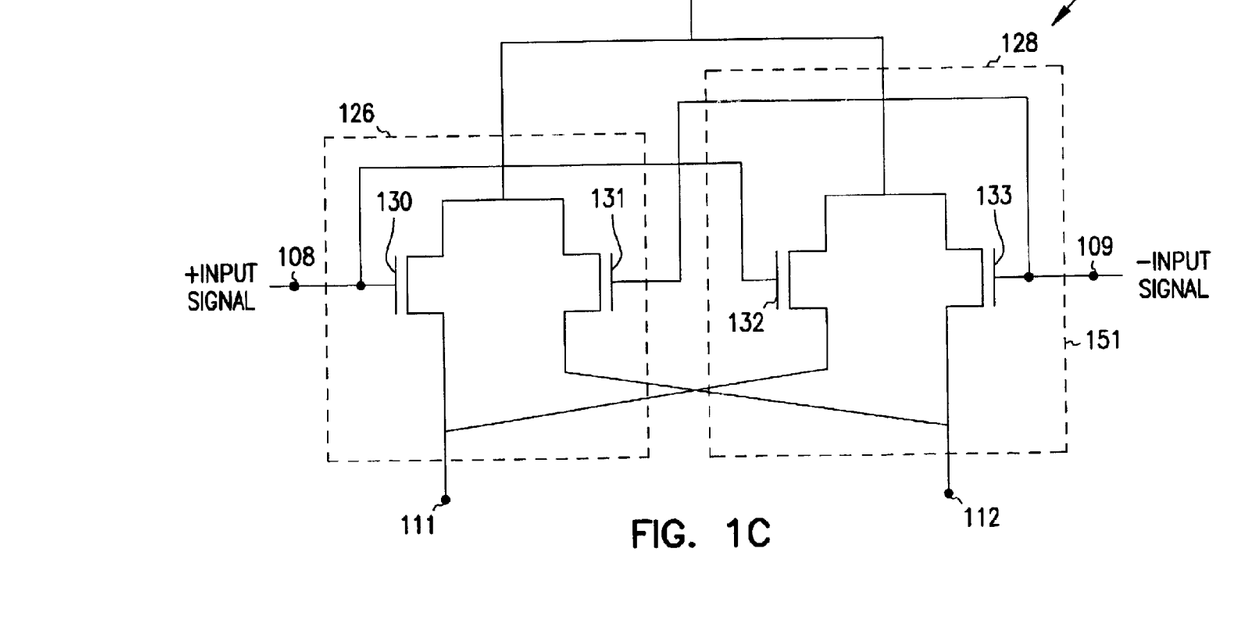
FIG. 1C is a schematic diagram of an alternative embodiment of the differential amplifier shown in FIG. 1A, according to the teachings of the present invention.

Referring to FIG. 1C, in an alternative embodiment, the differential amplifier 106 (shown in FIG. 1A) comprises a pair of differential pairs 124, including differential pairs 126 and 128 comprising n-channel isolated gate field-effect transistors 130–131 and 132–133, respectively, configured as shown in FIG. 1C.

Figure 1D:
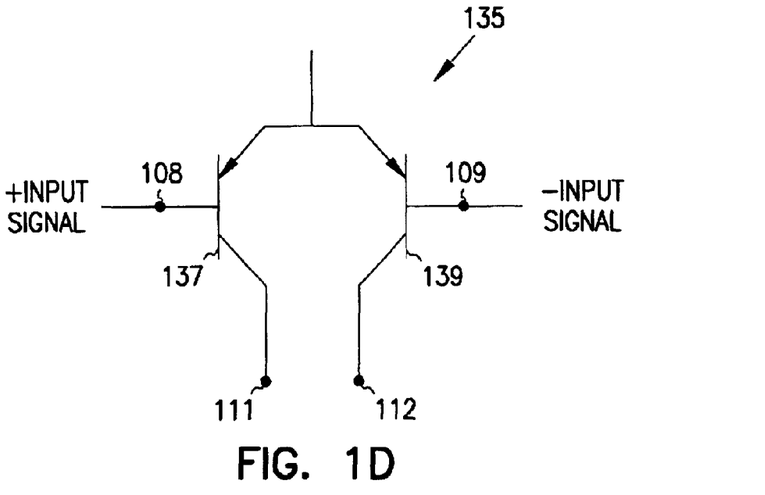
FIG. 1D is a schematic diagram of another alternative embodiment of the differential amplifier shown in FIG. 1A, according to the teachings of the present invention.

Referring to FIG. 1D, in another alternative embodiment, the differential amplifier 106 (shown in FIG. 1A) comprises a differential pair 135, including bipolar junction transistors 137 and 139, configured as shown in FIG. 1D.

Selecting a differential pair or a pair of differential pairs for the differential amplifier 106 allows the first amplifier stage 102 to have a high bandwidth.

Referring again to FIG. 1A, in operation, the differential amplifier 106 receives a +INPUT SIGNAL and a −INPUT SIGNAL at the pair of input nodes 108 and 109, respectively, and generates an amplified signal at the pair of output nodes 111 and 112 by amplifying the difference between the +INPUT SIGNAL and the −INPUT SIGNAL.

Figure 1E:
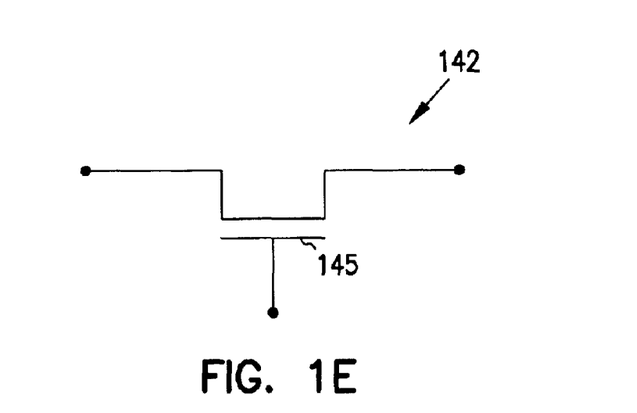
FIG. 1E is a schematic diagram of one embodiment of the switch shown in FIG. 1A, according to the teachings of the present invention.

The switch 114 is not limited to a particular type of switch. In one embodiment, the switch 114 is an electronically controllable switch. Referring to FIG. 1E, one exemplary embodiment of an electronically controllable switch suitable for use in connection with the present invention is isolated gate field-effect transistor 142.

Figure 1F:
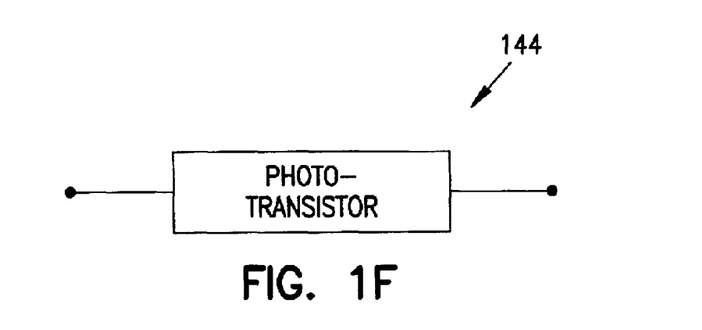
FIG. 1F is a schematic diagram of an alternative embodiment of the switch shown in FIG. 1A, according to the teachings of the present invention.

In an alternative embodiment, the switch 114 is an optically controllable switch. Referring to FIG. 1F, one exemplary embodiment of an optically controllable switch suitable for use in connection with the present invention is photo-transistor 144. Using an optically controllable switch, such as the photo-transistor 144, for the switch 114 in the comparator unit 100 reduces the electrical noise in the comparator unit 100 by eliminating an electrical signal transmission line and the noise associated with an electrical signal transmission line from the comparator unit 100.

In operation, the switch 114, when closed, provides a conductive path between nodes 111 and 112 to equalize the potential at the nodes 111 and 112. The isolated gate field-effect transistor switch 142, shown in FIG. 1E, is opened and closed by applying an electronic clock signal (not shown) to the gate 145 of the isolated gate field-effect transistor switch 142. The photo-transistor 144, shown in FIG. 1F, is opened and closed by applying an optical clock signal (not shown) to the base (not shown) of the phototransistor 144.

Figure 1G:
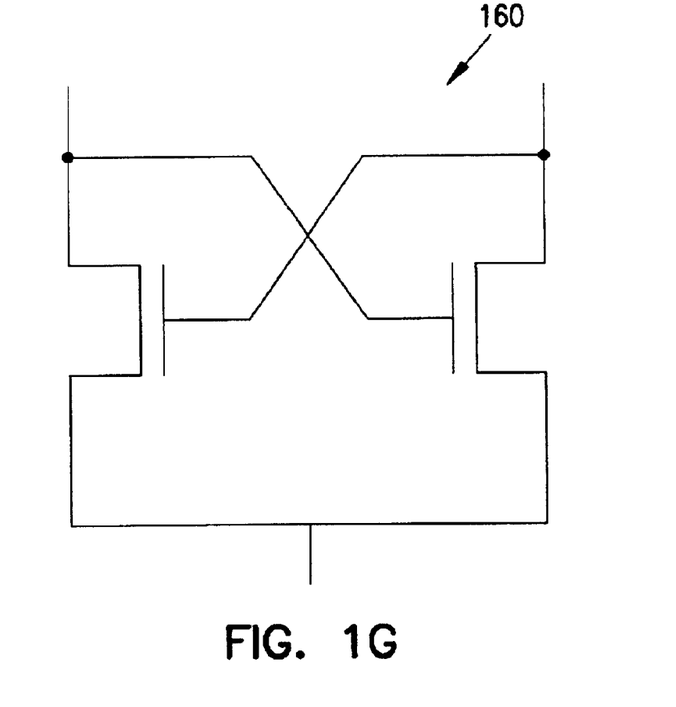
FIG. 1G is a schematic diagram of one embodiment of the non-linear load shown in FIG. 1A, according to the teachings of the present invention.

The non-linear load 116 is not limited to a particular type of non-linear load. Referring to FIG. 1G, in one embodiment, the non-linear load 116 comprises a pair of cross-coupled n-channel, isolated gate field-effect transistors 160 and 162, configured as shown in FIG. 1G.

Figure 1H:
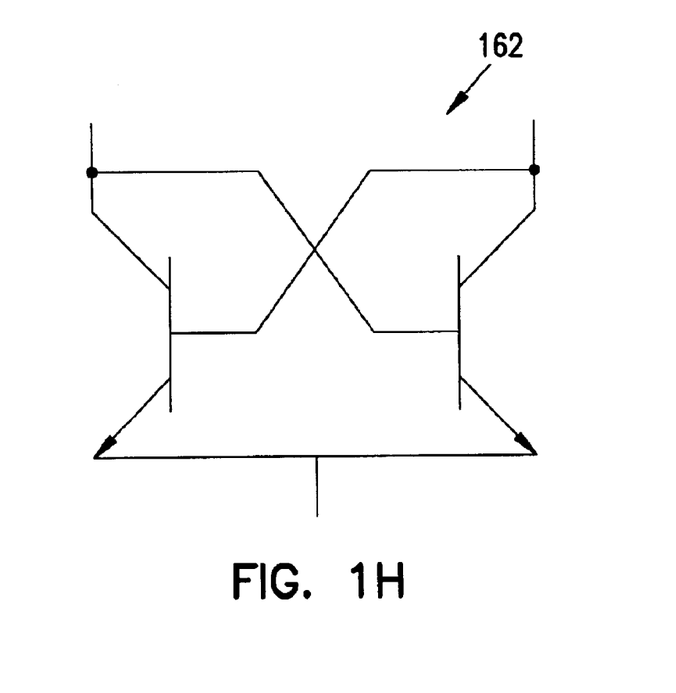
FIG. 1H is a schematic diagram of an alternative embodiment of the non-linear load shown in FIG. 1A, according to the teachings of the present invention.

Referring to FIG. 1H, in an alternative embodiment, the non-linear load 116 comprises a pair of cross-coupled bipolar junction transistors 164 and 166, configured as shown in FIG. 1H.

In operation, the non-linear load 116 allows the signals at the output nodes 111 and 112 to reach the supply voltages (not shown) and supports a higher slew rate or bandwidth for signals at output nodes 111 and 112 than a linear load.

The second amplifier stage 104 is coupled to the pair of output nodes 111 and 112 of the first amplifier stage 102. The second amplifier stage 104, in one embodiment, includes a pair of second stage input nodes 170 and 172, a pair of second-stage output nodes 174 and 176, a pair of cross-coupled n-channel isolated gate field-effect transistors 178 and 180, a pair of cross-coupled p-channel isolated gate field-effect transistors 182 and 184, a switch 186, and input pair of n-channel isolated gate field-effect input transistors 188 and 190. The input pair of n-channel isolated gate field-effect input transistors 188 and 190 are coupled to the input nodes 170 and 172. The n-channel isolated gate field effect input transistor 188 is connected in parallel with the n-channel isolated gate field-effect transistor 178, and the n-channel isolated gate field-effect input transistor 190 is connected in parallel with the n-channel isolated gate field-effect transistor 180. The pair of cross-coupled p-channel isolated gate field-effect transistors 182 and 184 and the switch 186 are connected between the second stage output nodes 174 and 176. The second amplifier stage 104 is a non-linear amplifier.

Combining a non-linear load 116 in the first amplifier stage 102 with a non-linear amplifier in the second stage amplifier 104 allows the comparator unit 100 to have a high gain.

Figure 2:
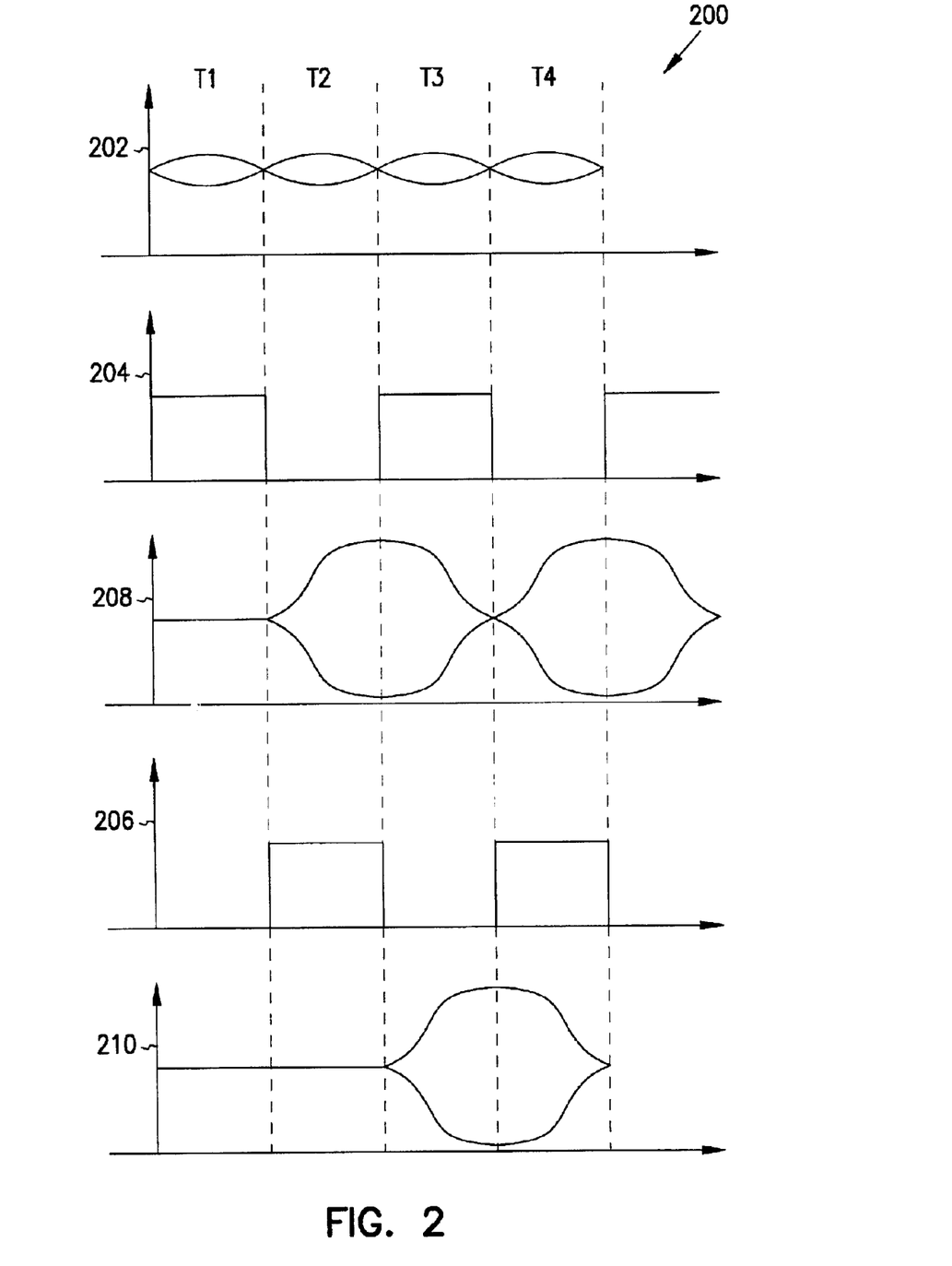
FIG. 2 is a timing diagram illustrating signals processed and generated by the comparator unit shown in FIG. 1A, according to the teachings of the present invention.

FIG. 2 is a timing diagram 200 illustrating signals processed and generated by the comparator unit 100 shown in FIG. 1A, according to the teachings of the present invention. The comparator unit 100 receives three input signals—a differential input signal 202 including the +INPUT SIGNAL and the −INPUT SIGNAL at the pair of input nodes 111 and 112 of the differential amplifier 106, the CLOCK SIGNAL 204 at the switch 114, and a DELAYED CLOCK SIGNAL 206 at the switch 186. The comparator unit 100 generates an amplified differential signal 208 at the pair of output nodes 111 and 112 and a differential output signal 210 including the +OUTPUT SIGNAL and the −OUTPUT SIGNAL at the pair of second amplifier stage output nodes 174 and 176.

In FIG. 2, for the purpose of clarity in the illustration, the CLOCK SIGNAL 204 and the DELAYED CLOCK SIGNAL 206 are shown as being one-hundred and eighty degrees out of phase. However, in a preferred embodiment, the DELAYED CLOCK SIGNAL 206 lags the CLOCK SIGNAL 204 by about one gate delay (for example one inverter delay). In an alternative embodiment, the DELAYED CLOCK SIGNAL 206 has a phase delay with respect to the CLOCK SIGNAL 204 of about ten degrees.

The timing diagram 200 shows the signals described above during the four time periods T1, T2, T3 and T4. During the T1 time period, in the first amplifier stage 102, the switch 114 is closed by the CLOCK SIGNAL 204 to equalize the pair of output nodes 111 and 112 to a common potential as can be seen in amplified differential signal 208. During the T2 time period, in the first amplifier stage 102, the switch 114 is opened by the CLOCK SIGNAL 204, and in the second amplifier stage 104, the switch 186 is closed by the DELAYED CLOCK SIGNAL 206. The pair of output nodes 111 and 112 assume potential values that represent an amplified difference between the +INPUT SIGNAL and the −INPUT SIGNAL, as can be seen in amplified differential signal 208, and the pair of second stage output nodes 174 and 176 are equalized to a common potential, as can be seen at the differential output signal 210. During the T3 time period, in the first amplifier stage 102, the switch 114 is closed by the CLOCK SIGNAL 204, and in the second amplifier stage 104, the switch 186 is opened by the DELAYED CLOCK SIGNAL 206. The pair of output nodes 111 and 112 are equalized to a common potential, as can be seen in amplified differential signal 208, and the pair of second stage output nodes 174 and 176 assume potential values that represent an amplified difference between the signals at the pair of second stage input nodes 170 and 172, as can be seen at the differential output signal 210.

For the CLOCK SIGNAL 204, the time periods T1 and T3 are sometimes referred to as equalization phases, and the time periods T2 and T4 are sometimes referred to as evaluation phases. Similarly, for the DELAYED CLOCK SIGNAL 206, the time periods T2 and T4 are sometimes referred to as equalization phases, and the time periods T1 and T3 are sometimes referred to as evaluation phases. As described above, in an equalization phase a pair of nodes are equalized to a potential, and in an evaluation phase an amplifier amplifies an input signal.

Figure 3:
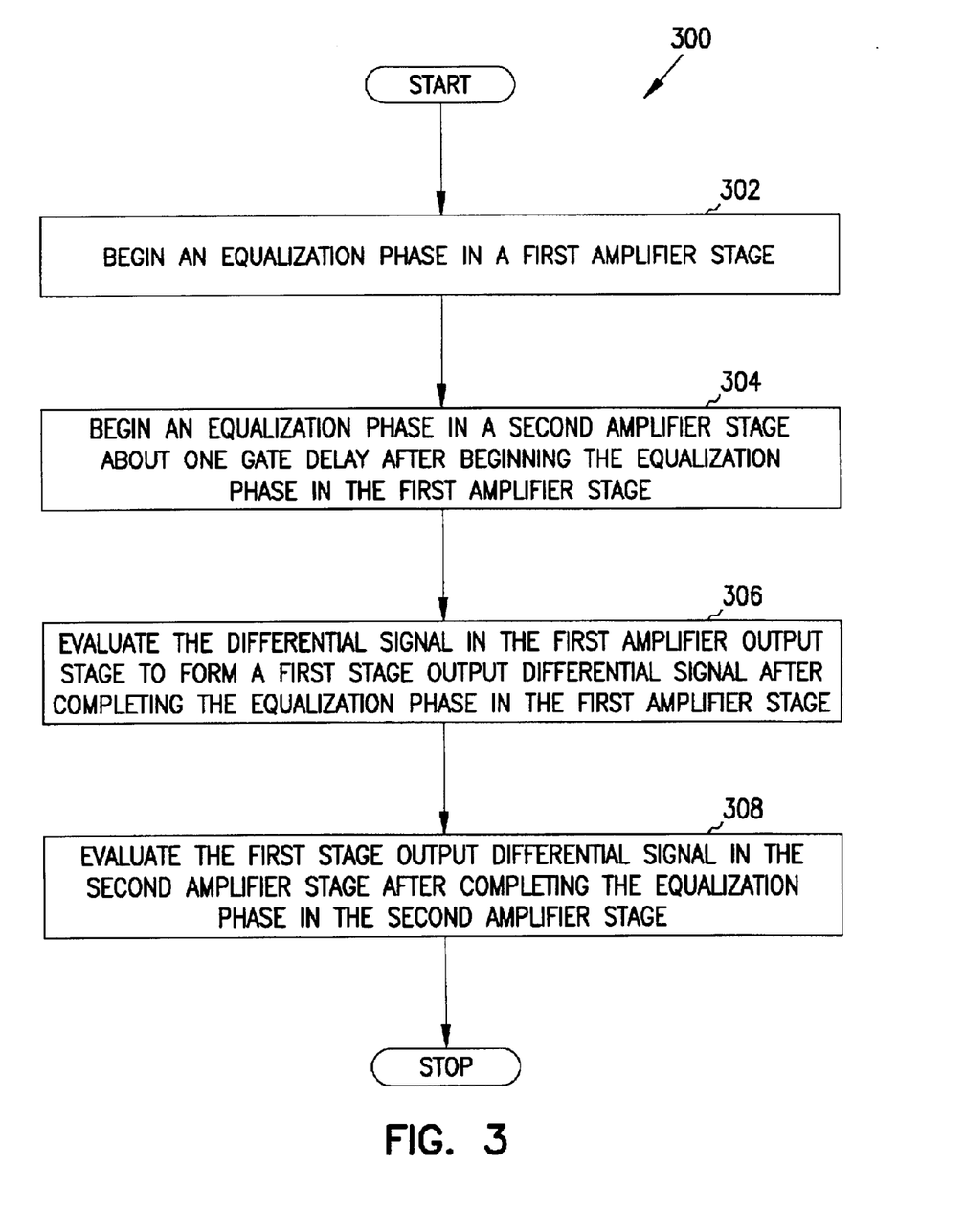
FIG. 3 is a flow diagram of one embodiment of a method of processing a differential signal, according to the teachings of the present invention.

FIG. 3 is a flow diagram of one embodiment of a method 300 of processing a differential signal, according to the teachings of the present invention. The method 300 includes the operations shown in blocks 302, 304, 306, and 308.

In 302, an equalization phase in a first amplifier stage begins. For example, referring to FIG. 1A, to begin an equalization phase in the first amplifier stage 102 a phase of the clock signal is provided to the switch 114 to close the switch 114 to equalize the potential at the nodes 111 and 112.

In 304, an equalization phase in a second amplifier stage begins about one gate delay after the beginning of the equalization phase in the first amplifier stage. For example, referring to FIG. 1A, to begin an equalization phase in the second amplifier stage 104 a phase of the delayed clock signal is provided to the switch 186 to close the switch 186 about one gate delay (or about 10% of the period of the clock signal) after applying a phase of the clock signal to the switch 114 to close the switch 114.

In 306, the differential signal in the first amplifier output stage is evaluated to form a first stage output differential signal after completing the equalization phase in the first amplifier stage. For example, referring to FIG. 1A, to evaluate the differential signal in the first amplifier output stage 102, the differential input signal is amplified in the first amplifier stage 102 after the end of an equalization phase of the clock signal.

In 308, the first stage output differential signal is evaluated in the second amplifier stage after completing the equalization phase in the second amplifier stage. For example, referring to FIG. 1A, to evaluate the first stage 102 output differential signal in the second stage amplifier 104, the first stage amplifier 102 output differential signal is amplified by a non-linear amplifier in the second amplifier stage 104 after the end of an equalization phase of the delayed clock signal.

Referring again to FIG. 1A, the first amplifier stage 102, in an alternative embodiment, includes the differential amplifier 106, switches 164 and 166, and the non-linear load 116. The differential amplifier 106 includes the pair of input nodes 108 and 109 and the pair of output nodes 111 and 112. The non-linear load 116 is connected across the pair of output nodes 111 and 112. The switch 164 is connected between the output node 111 and a common node 168, and the switch 166 is connected between the output node 112 and a common node 168.

The switches 164 and 166 are connected between the output nodes 111 and 112 and the common node 168 and, when closed, equalize the voltage at the nodes 111 and 112 by providing a conductive path between the nodes 111 and 112 and the common node 168. The switches 164 and 166, as used in connection with the present invention, are not limited to a particular type of switch. In one embodiment, the switches 164 and 166 are electrically controllable switches. One exemplary embodiment of an electrically controllable switch suitable for use in connection with the present invention is the isolated gate field-effect transistor 142 shown in FIG. 1E. In an alternative embodiment, the switches 164 and 166 are optically controllable switches. One exemplary embodiment of an optically controllable switch suitable for use in connection with the present invention is the photo-transistor 144 shown in FIG. 1F. In still another alternative embodiment the switch 164 is an electrically controllable switch and the switch 166 is an optically controllable switch. Selecting an optically controllable switch for the switch 166 reduces electrical noise in the comparator unit 100.

In operation, the comparator 100, in the above-described embodiment, functions as shown in FIG. 2, except that the signal 204 (shown in FIG. 2) opens and closes switches 164 and 166 (instead of switch 114) to equalize the output nodes 111 and 112 to the potential at the common node 168.

Figure 4:
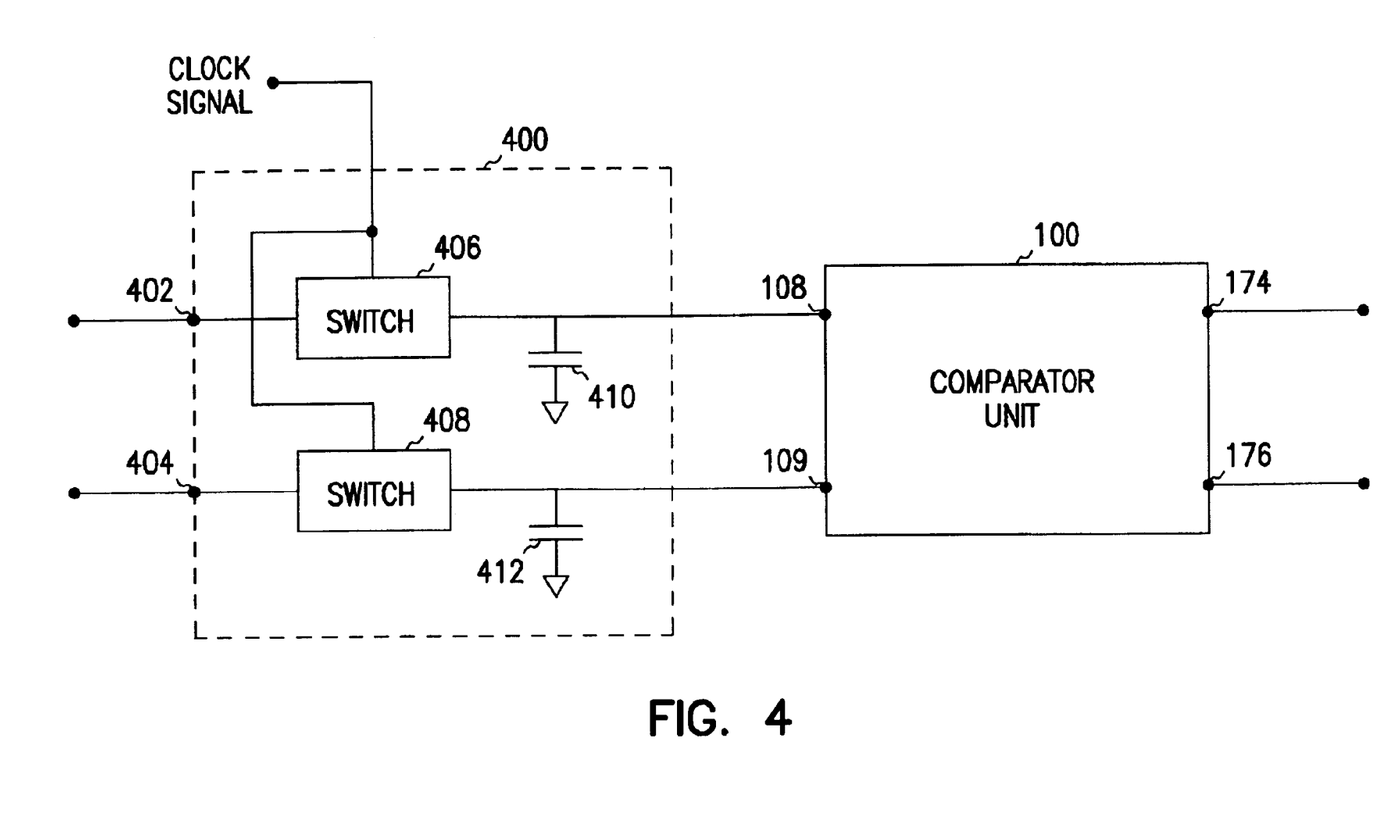
FIG. 4 is a block diagram of some embodiments of a sample-and-hold unit coupled to a comparator unit, according to the teachings of the present invention.

FIG. 4 is a block diagram of some embodiments of a sample-and-hold unit 400 coupled to a comparator unit 100, according to the teachings of the present invention. The sample-and-hold unit 400 includes input nodes 402 and 404 coupled to switches 406 and 408. The switches 406 and 408 are coupled to the capacitors 410 and 412, and the capacitors 410 and 412 are coupled to input nodes 108 and 109 of the comparator unit 100.

In operation, the sample-and-hold unit 400 receives a differential signal at the input nodes 402 and 404. The sample-and-hold unit 400 samples the differential signal when the switches are closed and holds the differential signal at the capacitors 410 and 412 when the switches are open. A CLOCK SIGNAL is coupled to the switches 406 and 408 to open and close the switches. Preferably, the comparator unit 100 processes the sampled signal during the hold time. Sampling the differential signal prior to processing by the comparator unit 100 reduces the probability of the comparator unit 100 processing spurious noise signals.

Figure 5:
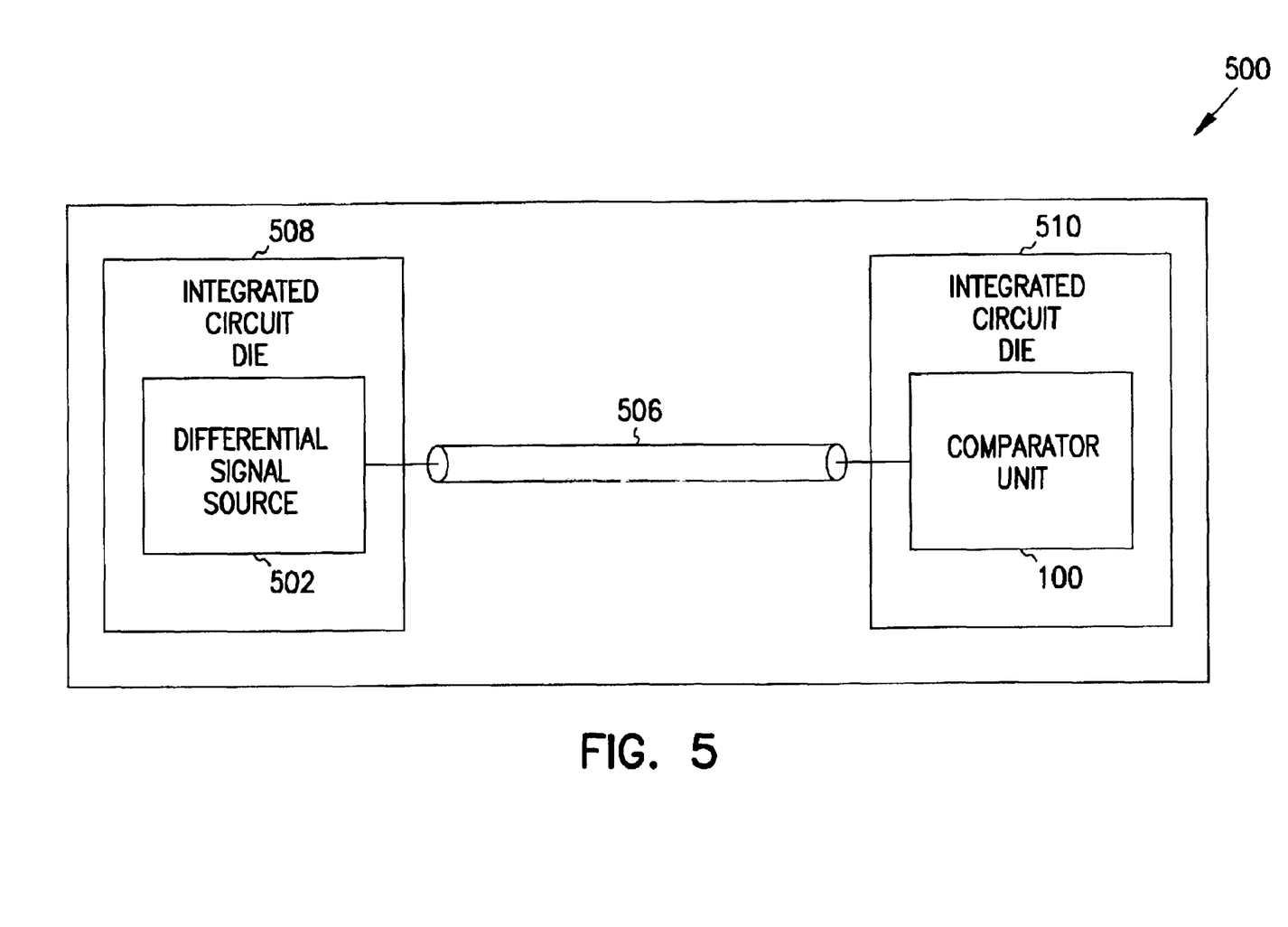
FIG. 5 is a block diagram of some embodiments of a signal transmission unit, according to the teachings of the present invention.

FIG. 5 is a block diagram of some embodiments of a signal transmission unit 500, according to the teachings of the present invention. The signal transmission unit 500, in one embodiment, includes a differential signal source 502, a comparator unit 100, and a transmission line 506. The transmission line 506 couples the differential signal source 502 to the comparator unit 100.

The signal transmission unit 500, in an alternative embodiment, includes the differential signal source 502 formed on a first integrated circuit die 508, the comparator unit 100 formed on a second integrated circuit die 510, and the first integrated circuit die 508 and the second integrated circuit die 510 and the transmission line 506 formed on a substrate 512. In one embodiment, the first integrated circuit die 508 comprises a processor unit, and the second integrated circuit die 510 comprises a processor unit. In an alternative embodiment, the first integrated circuit die 503 comprises a communication unit, and the second integrated circuit die 510 comprises a processor unit. In another alternative embodiment, the first integrated circuit die 508 comprises a data storage unit, and the second integrated circuit die 510 comprises a processor unit.

The substrate 512 is not limited to being fabricated from a particular material. In one embodiment, the substrate 512 comprises a semiconductor. In an alternative embodiment, the substrate 512 comprises a ceramic. In still another alternative embodiment, the substrate 512 comprises a dielectric.

In operation, the differential signal source 502 transmits a differential signal (such as the differential signal 202 shown in FIG. 2) on the transmission line 506. The differential signal is received and processed, as described above, by the comparator unit 100 shown in FIG. 1A.

Biasing circuits for the comparator embodiments described above have not been included in the figures because, as those skilled in the art will appreciate, there are many bias circuits suitable for use in connection with the comparators of the present invention and the design of such circuits are known to those skilled in the art.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A comparator unit comprising:
a first amplifier stage including a differential amplifier having a pair of input nodes for outputting a differential signal and a pair of output nodes, a switch connected across the pair of output nodes, and a non-linear load connected across the pair of output nodes; and a second amplifier stage coupled to the pair of output nodes, the second amplifier stage including an input pair of isolated gate field-effect transistors for receiving a differential signal and a cross-coupled pair of isolated gate field-effect transistors, wherein each of the cross-coupled pair of isolated gate field-effect transistors is coupled in parallel with a corresponding one of the input pair of isolated gate field-effect transistors.

2. The comparator unit of claim 1, wherein the differential amplifier comprises a pair of differential pairs of isolated gate field-effect transistors.

3. The comparator unit of claim 2, wherein the switch comprises an electronically controllable switch.

4. The comparator unit of claim 3, wherein the electronically controllable switch comprises an isolated gate field-effect transistor.

5. The comparator unit of claim 4, wherein the non-linear load comprises a pair of cross-coupled isolated gate field-effect transistors.

6. The comparator unit of claim 5, wherein each transistor in the pair of cross-coupled isolated gate field-effect transistors comprises an n-channel isolated gate field-effect transistor.

7. The comparator unit of claim 1, wherein the second amplifier stage comprises a non-linear amplifier.

8. The comparator unit of claim 7, wherein the second amplifier stage includes a pair of second stage output nodes and a switch connected across the pair of second stage output nodes.

9. The comparator unit of claim 1, wherein the differential amplifier comprises a differential pair of isolated gate field-effect transistors.

10. A comparator unit comprising:

a first amplifier stage including a differential amplifier having a pair of input nodes for outputting a differential signal and a pair of output nodes, a switch connected across the pair of output nodes, and a non-linear load connected across the pair of output nodes; and a second amplifier stage including an input pair of isolated gate field-effect transistors for receiving the differential signal and a cross-coupled pair of isolated gate field-effect transistors, the input pair of isolated gate field-effect transistors having a pair of gates, wherein the pair of gates are coupled to the pair of output nodes and each of the cross-coupled pair of isolated gate field-effect transistors is coupled in parallel with a corresponding one of the input pair of isolated gate field-effect transistors.

11. The comparator unit of claim 10, wherein the differential amplifier comprises a pair of differential pairs of isolated gate field-effect transistors.

12. The comparator unit of claim 11, wherein the switch comprises an electronically controllable switch.

13. The comparator unit of claim 12, wherein the electronically controllable switch comprises an isolated gate field-effect transistor.

14. The comparator unit of claim 13, wherein the non-linear load comprises a pair of cross-coupled isolated gate field-effect transistors.

15. The comparator unit of claim 14, wherein each transistor in the pair of cross-coupled isolated gate field-effect transistors comprises an n-channel isolated gate field-effect transistor.

16. The comparator unit of claim 10, wherein the second amplifier stage comprises a non-linear amplifier.

17. The comparator unit of claim 16, wherein the second amplifier stage includes a pair of second stage output nodes and a switch connected across the pair of second stage output nodes.

18. The comparator unit of claim 10, wherein the differential amplifier comprises a differential pair of isolated gate field-effect transistors.

* * * * *

UNITED STATES PATENT AND TRADEMARK OFFICE
CERTIFICATE OF CORRECTION

PATENT NO. : 6,825,696 B2
DATED : November 30, 2004
INVENTOR(S) : Jaussi et al.

It is certified that error appears in the above-identified patent and that said Letters Patent is hereby corrected as shown below:

<u>Column 7,</u>
Line 6, delete "a" and insert -- the -- before "differential".

Signed and Sealed this

Fifteenth Day of November, 2005

JON W. DUDAS
*Director of the United States Patent and Trademark Office*